United States Patent [19]

Taira et al.

[11] Patent Number: 5,124,771
[45] Date of Patent: Jun. 23, 1992

[54] SEMICONDUCTOR DEVICE

[75] Inventors: Kenichi Taira; Ichiro Hase; Hiroji Kawai, all of Tokyo, Japan

[73] Assignee: Sony Corporation, Tokyo, Japan

[21] Appl. No.: 647,411

[22] Filed: Jan. 29, 1991

[30] Foreign Application Priority Data

Jan. 29, 1990 [JP] Japan .................................. 2-18707

[51] Int. Cl.$^5$ .................. H01L 29/72; H01L 29/161; H01L 29/12; H01L 29/20
[52] U.S. Cl. ........................................ 357/34; 357/16; 357/58; 357/61
[58] Field of Search .................... 357/34, 16, 58, 61

[56]  References Cited
FOREIGN PATENT DOCUMENTS 0299686  1/1989  European Pat. Off. .
63-229752  9/1988  Japan .

OTHER PUBLICATIONS

Applied Physics Letters, vol. 51, #13, pp. 984–986, Sep. 1987 by Levi et al.

Primary Examiner—Mark Prenty
Attorney, Agent, or Firm—Hill, Van Santen, Steadman & Simpson

[57]  ABSTRACT

A semiconductor device or a hot electron transistor being constructed such that an InAs base layer is sandwiched between a GaSb emitter barrier layer and a GaInAsSb-system collector barrier layer, which results in preventing hot electrons of unnecessarily high energy from being injected into the collector and an avalanche current from being generated, thereby making it possible to improve the saturation characteristics of the device.

5 Claims, 2 Drawing Sheets

12
SEMICONDUCTOR DEVICE

BACKGROUND OF THE INVENTION

1. Field of the Invention

The present invention relates to a semiconductor device, and more particularly to a hot electron transistor (HET).

2. Description of the Prior Art

Recently, enthusiastic research and development have been directed to an HET as an ultra-high speed element. An HET operable in a room temperature is disclosed in, for example, Applied Physics Letters Vol. 51, No. 13, pp 984-986, September 1987, which is constituted by disposing an emitter barrier layer 2 made of AλSb$_{0.92}$As$_{0.08}$ and a collector barrier layer 3 made of GaAs at opposite sides of a base layer 1 made of InAs respectively so as to sandwich the base layer 1 therebetween, as shown in FIG. 1 which is a band model diagram of its conduction band in a biasing state.

Since an offset gap $\Delta E_{B-C}$ of a conduction band between the base and the collector of the HET thus constructed is 0.8 eV, it is required that an offset gap $\Delta E_{B-E}$ of a conduction band of the emitter barrier layer between the base and the emitter is to be selected larger than the offset gap $\Delta E_{B-C}$. Accordingly, the offset gap $\Delta E_{B-E}$ of 1.3 eV is established for the HET. However, with the gap $\Delta E_{B-E}$ between the base and the emitter being such a high value of 1.3 eV, an energy of a hot electron injected from the emitter into the collector is too high to neglect the ionization in the collector due to the hot electron. More specifically, the hot electrons of high energy injected in the collector eject electrons from a valence band in the collector to generate an avalanche current, which degrades the saturation characteristics of the transistor. Hatched portions in FIG. 1 show an energy level where electrons exist.

In the transistor constructed as described above, a layer adjacent to the base layer 1 of In-system, that is, the emitter barrier layer 2 is made of Aλ-system, which causes a difficulty in setting a selection ratio of etching between the layers of the Aλ-system and the In-system. Accordingly, upon leading a base electrode from the base layer 1 of the In-system which forms this kind of HET in actual practice, there arises a problem that an etching process for partially removing the Al-system emitter barrier layer or emitter layer on the base layer 1 in order to partially expose the base layer 1 is extremely difficult.

OBJECTS AND SUMMARY OF THE INVENTION

Accordingly it is an object of the present invention to provide an HET having an InAs base layer which is capable of improving the saturation characteristics and symplifying the fabrication process thereof.

As an aspect of the present invention, a semiconductor device is comprised of an InAs base layer, a GaSb emitter barrier layer deposited on one side of the InAs base layer, and a GaInAsSb collector barrier layer deposited on the other side of said InAs layer, whereby the InAs base layer is sandwiched between the GaSb emitter barrier layer and the GaInAsSb collector barrier layer.

The above, and other objects, features, and advantages of the present invention will become apparent from the following detailed description of illustrative embodiment thereof to be read in conjunction with the accompanying drawings, in which like reference numerals represent the same or similar parts.

DETAILED DESCRIPTION OF THE PREFERRED EMBODIMENT

Before explaining a preferred embodiment of the present invention, reference will be made to the relationship between the band gap and the lattice constants of Ga$_x$In$_{1-x}$As$_y$Sb$_{1-y}$ which constitutes the principle of the present invention.

Figure 1:
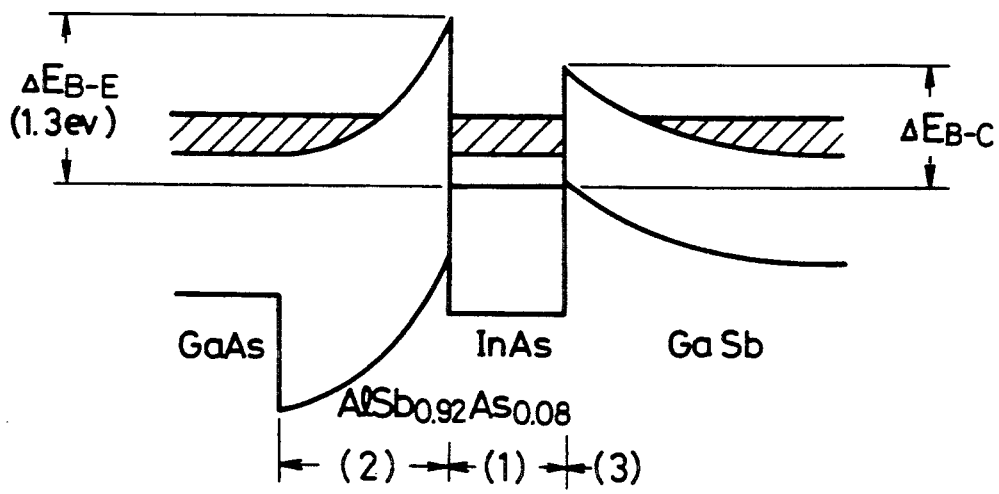
FIG. 1 is a diagram showing a band model of a conventional semiconductor device.
Figure 2:
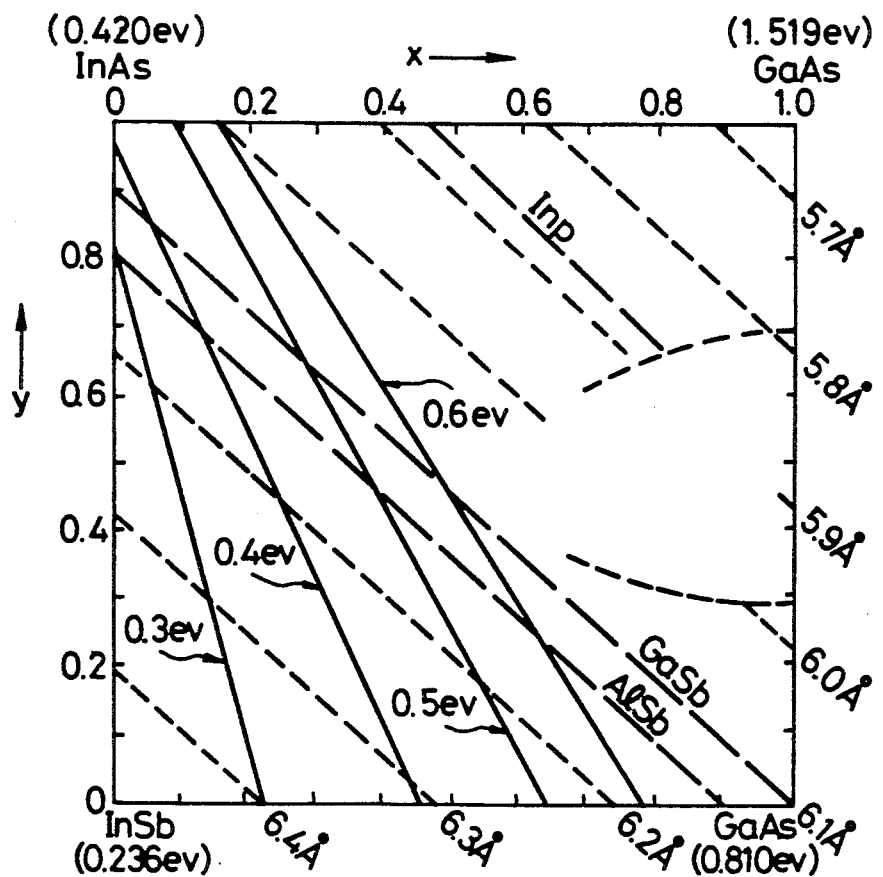
FIG. 2 is a graph showing the relationship among the composition of Ga$_x$In$_{1-x}$Sb$_{1-y}$, the band gap and the lattice constant thereof.

FIG. 2 is a graph showing the relationship among the composition, the band gap and the lattice constant of Ga$_x$In$_{1-x}$As$_y$Sb$_{1-y}$ shown on page 41 of "HETEROSTRUCTURE LASERS", Part B, by H. C. Casey, and Jr M. B. Panish, published by Academic Press. As is apparent from the graph, the GaInAsSb-system semiconductor has a band gap smaller than 0.8 eV. It is therefore possible to provide an offset gap $\Delta E_{B-C}$ of the conduction band between the base and the collector sufficiently smaller than 0.8 eV, and accordingly it is possible to provide an offset gap $\Delta E_{B-E}$ of the conduction band between the base and the emitter smaller than the conventional value of 1.3 eV, for example, 0.8 eV, by an emitter barrier layer made of GaSb.

Now, an embodiment of a semiconductor device or a hot electron transistor (HET) according to the present invention will be explained with reference to FIGS. 3 and 4.

Figure 3:
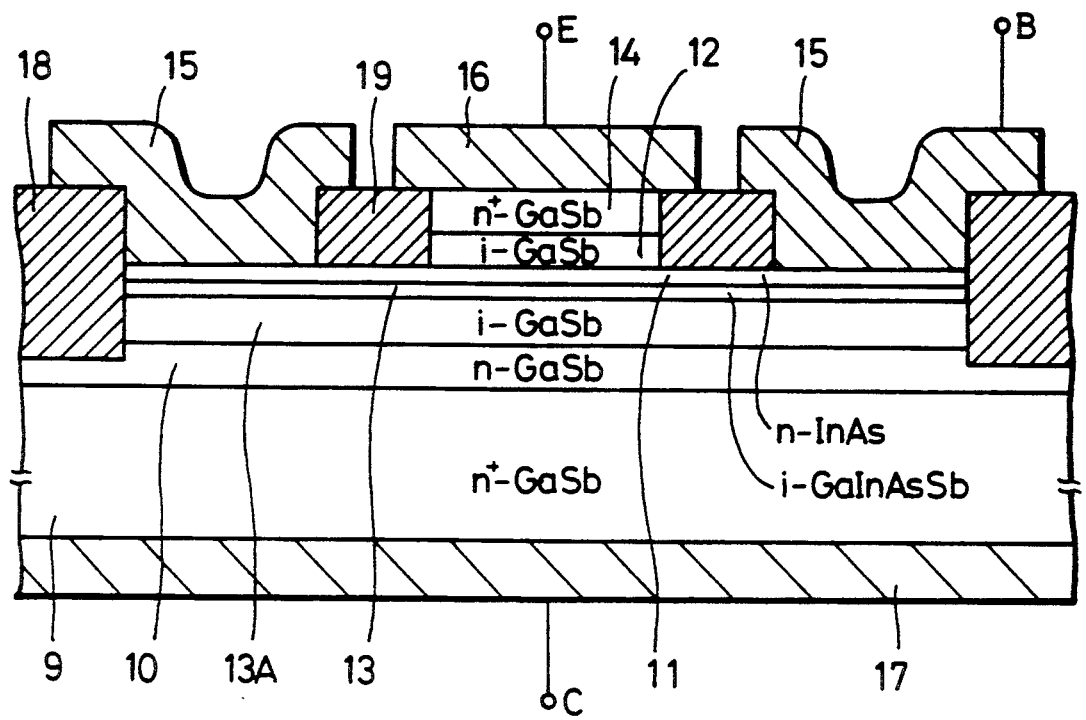
FIG. 3 is a cross-sectional view of an embodiment of a semiconductor device according to the present invention.

As shown in FIG. 3, on an n-type highly concentrated GaSb semiconductor substrate 9, there are sequentially formed an n-type GaSb collector layer 10 having a thickness of 2000 Å, an intrinsic GaSb underlaying layer 13A having a thickness of 1000 Å for a collector barrier layer, an intrinsic Ga$_x$In$_{1-x}$As$_y$Sb$_{1-y}$, for example, Ga$_{0.8}$In$_{0.2}$As$_{0.2}$Sb$_{0.8}$ collector barrier layer 13 having a thickness of 100 Å, an n-type InAs base layer 11 having a thickness of 100 Å, an intrinsic GaSb emitter barrier layer 12 having a thickness of 1000 Å, and an n-type highly concentration GaSb emitter layer 14 having a thickness of 2000 Å. Thereafter, the emitter layer 14 and the emitter barrier layer 12 are partially etched away by an etching method which has selectively in stching Ga-system and In-system materials, for example, a reactive ion etching (RIE) method using a CCl$_2$F$_2$+He system to thereby partially expose a part of the base layer 11. A base electrode 15 is made in ohmic contact with the exposed surface of the base layer 11, and simultaneously an emitter electrode 16 is deposited on the emitter layer 14 in an ohmic contact therewith. Further, a collector electrode 17 is ohmicly deposited, for example, on the rear surface of the substrate 9.

In the present embodiment, the offset gap $\Delta E_{B-E}$ between the base and the collector becomes 0.8 eV, while the offset gap $\Delta E_{B-C}$ between the base and the collector falls in a range of 0.4–0.8 eV, thereby making it possible for this device to operate as a transistor at a low temperature (room temperature).

Incidentally, when atomic ratios x and y of the collector barrier layer 13 composed of $Ga_xIn_{1-x}As_ySb_{1-y}$ are set in ranges of $0.8 < X < 1.0$ and $0 < y < 0.2$, respectively, the lattice constants thereof match or favorably match with the lattice constants of InAs constituting the base layer 11 to thereby make it possible to perform a good epitaxy. Further, it is possible to perform a good epitaxy of the GaSb emitter barrier layer 12 on this InAs base layer 11. Further, the offset gap $\Delta E_{B-E}$ between the base and the emitter can be fallen within a range of 0.4 eV–0.8 eV while the offset gap $\Delta E_{B-C}$ between the base and the collector can be determined as 0.8 eV.

The respective layers 10-13A-13-11-12-14 can be formed continuously and epitaxially as a series of works by the MOCVD (Metal Organic Chemical Vapor Deposition) method, MBE (molecular Beam Epitaxy) method and so on.

Reference numerals 18 and 19 in FIG. 3 respectively designate insulating layers, each made of, for example, oxide materials or the like.

While GaSb substrate 9 is used in the embodiment shown in FIG. 3, in some cases GaSb or InAs substrate of, for example, n-type having a high impurity concentration, i.e. low resistivity may be provided, and thereon the GaSb collector layer 10 may be epitaxially grown. Also in this case, the respective layers on the substrate 9 can be epitaxially grown successively by a series of works by the MOCVD method or the MBE method.

Figure 4:
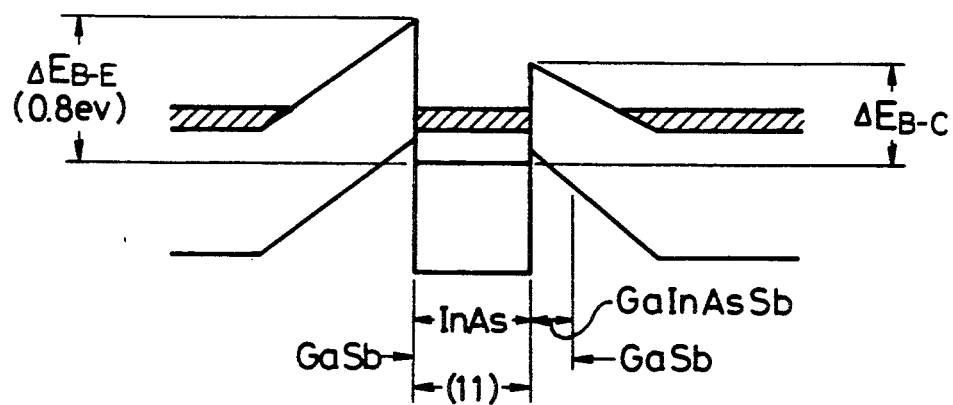
FIG. 4 is a band model diagram of the embodiment shown in FIG. 3.

According to the construction of the present invention having the band model shown in FIG. 4, when the collector barrier layer 13 is made of a compound semiconductor of GaInAsSb-system, the offset gap $\Delta E_{B-C}$ of the conduction band between the base and the collector can be made smaller than 0.8 eV. Further, when the emitter barrier layer 12 is made of GaSb, the offset gap $\Delta E_{B-E}$ of the conduction band between the base and the emitter of the emitter barrier layer 12 can be made such a relatively small value of 0.8 eV. Thus, it becomes possible to avoid such phenomena that hot electrons of unnecessarily high energy are introduced into the collector and that an avalanche current is generated, thereby making it possible to improve the saturation characteristics of the device.

Further, the selective etching for the emitter layer 14 and the emitter barrier layer 12 in order to partially expose the base layer 11 is performed by using the $CCl_2F_2$+He-system etching gas which has different etching speeds between the Ga-system material and In-system material, so that one portion of the base layer 11 can be exposed outside easily and positively.

Having described preferred embodiment of the invention with reference to the accompanying drawings, it is to be understood that the invention is not limited to the precise embodiment and that various changes and modifications thereof could be effected by one skilled in the art without departing from the spirit or scope of the novel concepts of the invention as defined in the appended claims.

We claim as our invention:

1. A semiconductor device comprising:
   an InAs base layer;
   an emitter layer and a collector layer disposed on opposite sides of said base layer;
   a GaSb emitter barrier layer deposited between said emitter layer and said InAs base layer; and
   a GaInAsSb collector barrier layer deposited between said collector layer and said InAs base layer, whereby said InAs base layer is sandwiched between said GaSb emitter barrier layer and said GaInAsSb collector barrier layer.

2. A semiconductor device according to claim 1 further comprising a GaSb substrate on which said collector barrier layer, said base layer and said emitter barrier layer are epitaxially deposited in sequence.

3. A semiconductor device according to claim 1, wherein said base layer, said emitter barrier layer and said collector barrier layer are formed by a metal organic chemical vapor deposition method.

4. A semiconductor device according to claim 1, wherein said base layer, said emitter barrier layer and said collector barrier layer are formed by a molecular beam epitaxy method.

5. A semiconductor device according to claim 1, wherein said base layer is of an n-type conductivity, said emitter barrier layer is of an i-type conductivity and said collecter barrier layer is of an i-type conductivity, respectively.

* * * * *